US005846909A

United States Patent [19]
McDevitt et al.

[11] Patent Number: 5,846,909
[45] Date of Patent: Dec. 8, 1998

[54] MOLECULAR LEVEL, PRECISION CONTROL OVER THE INTERFACIAL PROPERTIES OF HIGH-T$_C$ SUPERCONDUCTOR STRUCTURES AND DEVICES

[75] Inventors: John T. McDevitt, Austin, Tex.; Chad A. Mirkin, Skokie, Ill.

[73] Assignees: University of Texas System, Austin, Tex.; Northwestern University, Evanston, Ill.

[21] Appl. No.: 445,598

[22] Filed: May 22, 1995

[51] Int. Cl.$^6$ ...................................................... H01L 39/00
[52] U.S. Cl. .......................... 505/233; 505/230; 505/237; 505/434; 505/470; 505/473; 505/701; 505/704; 428/930; 428/689; 428/333; 428/338
[58] Field of Search ..................................... 428/930, 457, 428/447, 688, 689, 332, 333, 338; 505/233, 701, 230, 237, 704, 739, 434, 470, 473; 216/77

[56] References Cited

U.S. PATENT DOCUMENTS

| | | | |
|---|---|---|---|
| 4,911,800 | 3/1990 | Sadoway et al. | 204/56.1 |
| 5,079,221 | 1/1992 | Morohashi | 428/930 |
| 5,124,310 | 6/1992 | Ovshinsky et al. | 505/1 |
| 5,212,152 | 5/1993 | Lyon et al. | 505/1 |
| 5,229,358 | 7/1993 | Kumar | 505/1 |
| 5,264,412 | 11/1993 | Ota et al. | 505/1 |
| 5,288,697 | 2/1994 | Schrepp et al. | 505/470 |
| 5,487,792 | 1/1996 | King | 428/457 |
| 5,510,481 | 4/1996 | Bednarski | 428/447 |
| 5,545,289 | 8/1996 | Chen | 216/77 |

OTHER PUBLICATIONS

Chemically Tailored, Corrosion Resistant, High–T$_c$ Phases; J. Am. Chem. Soc., vol. 116, No. 20, 1994, pp. 9389–9390, Ji–Ping Zhou, et al.

Improved Corrosion Resistance of Cation Substituted YBa$_2$Cu$_3$O$_{7-\delta}$; Applied Physics Letter, Mar. 3, 1995, 12 pages; Ji–Ping Zhou, et al.

Superconducting Composite Films as Chemical Sensors; Chemtech, 24, 1994, pp. 24–30; John T. McDevitt, et al.

Aqueous Electrochemistry of Cuprate–Based High T$_c$ Superconductors J. Ele. Soc., Jul., 1987, pp. 1863–1864, J. M. Rosamilia, et al.

Chemical Durability of High–Temperature Superconductor YBa$_2$Cu$_3$O$_{7-x}$ In Aqueous Environments; Appl. Phys. Lett., vol. 52, No. 4, Jan. 25, 1988, pp. 323–325, Narottam P. Bansal, et al.

Voltammetry of Self–Assembled Ferroceneoctanethiol Mololayers on Metal–Coated High–Temperature Superconductor Electrodes at Sub–T$_c$ Temperatures; J.Am.Chem.Soc. 1995, 117, pp. 1121–1126.

(List continued on next page.)

*Primary Examiner*—Marie Yamnitzky
*Attorney, Agent, or Firm*—Edward J. Timmer

[57] ABSTRACT

Use of monolayer films for the direct modification of high-T$_c$ superconductor structures and devices. Methods for the formation of superconductor localized monolayer films have been discovered based on the spontaneous adsorption of molecules containing ligating functionalities, such as alkylamine, arylamine, and alkylthiol moieties. Molecules containing these types of functionalities are found to bind tenaciously to the metal ions which form the high-T$_c$ superconductor surface. The derivatized superconductor structures can be prepared simply by soaking the high-T$_c$, superconductor structure or device in a dry organic solvent system which contains the derivatizing agent. Large changes in the superconductor interfacial properties can be achieved with such procedures allowing for the atomic level control of the surface properties of the superconductor. This discovery is particularly important to provide a) new methods to fabricate superconductor devices with atomic level precision, b) to form defect-free anti-corrosion layers, c) improved/optimized methods for lithographic processing of high-T$_c$ devices, and d) improved adhesion of protective layers by surface-modification.

20 Claims, 7 Drawing Sheets

OTHER PUBLICATIONS

Electric Field Effect in High $T_c$ Superconducting Ultrathin $YBa_2Cu_3O_{7-x}$ Films; Appl. Phys. Lett 59 (26), Dec. 23, 1991, pp. 3470–3472, X. X. Xi, et al.

Electric Field Effect on Superconducting $YBa_2Cu_3O_{7-\delta}$ Films, Dec. 19, 1990, 5 pages, J. Mannhart, et al.

Water Interaction With the Superconducting $YBa_2Cu_3O_7$ Phase, Appl. Phys. Lett. 51 (7), Aug. 17, 1987, pp. 532–534, M. F. Yan, et al.

Stability of Superconducting $YBa_2Cu_3O_7$ in the Presence of Water, Appl. Phys. Lett. 51 (17), Oct. 26, 1987, pp. 1373–1375, R. L. Barns, et al.

Environmental Stability of High $T_c$ Superconducting Ceramics, MRS Bulletin, Sep., 1993, pp. 45–52, Aaron Barkatt, et al.

Small Orders, Chemistry in Britain, Apr., 1994, pp. 292–295, John T. McDevitt.

Preparation and Characterized of $Yba_2Cu_3O_{7-\delta}$/Polypyrrole Bilayer Structures; J. Am. Chem. Soc., vol. 116, No. 22, 1994, pp. 9979–9986, Steven G. Haupt, et al.

Epoxy–Encapsulated Ceramic Superconductor Microelectrodes; J. Electrochem. Soc., vol. 136, No. 12, Dec., 1989, pp. 3696–3701, Rebecca O. Gollmar, et al.

Electrochemically Assessed Corrosion Reactivity of $YBa_2Cu_3O_7$ Electrodes, J. Electroanal. Chem., 295 (1990) pp. 373–384, David R. Riley, et al.

Electrochemical Response of $YBa_2Cu_3O_{7-x}$ as a Function of Oxygen Content, J. Electrochem. Soc., vol. 139, No. 8, Aug., 1992, pp. 2340–2346, David R. Riley, et al.

Corrosion Reactions of $YBa_2Cu_3O_{7-x}$ and $Tl_2Ba_2Ca_2Cu_3O_{10+x}$ Superconductor Phases in Aqueous Environments, Chem. Mater., 1992, 4, pp. 953–959, Ji–Ping Zhou, et al.

Superconductors That See Red, Green, and Blue, Science, vol. 256, Apr. 24, 1992, pp. 442–443.

Color–Specific Light Detector Demonstrated, Apr. 13, 1992, C & EN "News of the Week", p. 6.

Optical Devices Based on Dye–Coated Superconductor Junctions: An Example of a Composite Molecule–Superconductor Device; J. Am. Chem. Soc., 1992, 114, 2 pages, Jianai Zhao, et al.

Electrochemical Investigations of Various High–Temperature Superconductor Phases, Chem. Mater., vol. 4, No. 6, 1992, pp. 1176–1182.

Relative Corrosion Reactivity and Surface Microstructure of $YBa_2Cu_3O_{7-x}$ Samples with Different Oxygen Contents; Chem. Mater. 1993, 5, pp. 361–365, Ji–Ping Zhou, et al.

Reversible Modulation of $T_c$ in Conductive Polymer/High Temperature Superconductor Assemblies, J. Am. Chem. Soc. vol. 113, No. 5, 1993, Steven G. Haupt, et al.

Polymer Film Effect is Basis of Molecular Switch, Feb. 22, 1993 C&EN, pp. 24–25.

YBa₂Cu₃O₇₋δ\MgO(100) Film Before Modification

$YBa_2Cu_3O_{7-\delta}$\MgO(100) Film After Modified With $FcC(O)NHCH_2CH_2NH_2$

MOLECULAR LEVEL, PRECISION CONTROL OVER THE INTERFACIAL PROPERTIES OF HIGH-$T_c$ SUPERCONDUCTOR STRUCTURES AND DEVICES

CONTRACTURAL ORIGIN OF THE INVENTION

This invention was made with Government support under Grant Numbers: DMR-9058437 and CHE-9357099 awarded by the National Science Foundation. The work was also supported by the Office of Naval Research under Grant No: N00014-94-10706. The Government may have certain rights in the invention. The National Science Foundation and the Office of Naval Research reserve the right to a royalty-free, nonexclusive, nontransferable, irrevocable licence to practice or have practiced for or on behalf of the United States the invention throughout the world.

FIELD OF THE INVENTION

The present invention relates to the chemical modification of reactive surfaces of high-$T_c$ oxide superconductor surfaces by direct molecule adsorption to alter or control reactivity or other interfacial surface property. The present invention will find utility in the packaging, processing, and preparation of thin film superconductor devices as well as in the protection of bulk ceramic superconductor forms such as wires, tapes, and pellets.

BACKGROUND OF THE INVENTION

One of the major problems that has slowed technological development of copper oxide (cuprate) superconductors has been their tendency to degrade chemically when exposed to water, acids, $CO_2$, and CO (MRS Bulletin 1993, 18, 45–52; Chemistry of Materials 1992, 4, 953–959; Chemistry of Materials 1993, 5, 361–365). Illustrative of some of the technologically important copper oxide superconductors with transition temperatures, $T_c$, above 77K (the boiling point of liquid nitrogen) are $YBa_2Cu_3O_7$, $Tl_2Ba_2Ca_2Cu_3O_{10}$, $Bi_2Sr_2CaCu_2O_8$ and $HgBa_2Ca_2Cu_3O_9$. Unfortunately, although the $YBa_2Cu_3{}_{O7}$ compound is the preferred material for superconducting thin film applications, this material exhibits the highest atmospheric corrosion reactivity (i.e. the least corrosion resistance) of the known cuprate superconductor materials (MRS Symposium Series-Layered Superconductors Fabrication, Properties and Application; San Francisco, Calif., 1992 and Appl. Phys. Lett. 1993, 63, 548).

The $YBa_2Cu_3O_{7-\delta}$ phase (where $\delta$ is greater than 0 and less than 1) has an oxygen-deficient perovskite crystal structure with a layer sequence of $Cu(1)O_x$—BaO—$Cu(2)O_2$—Y—$CU(2)O_2$—BaO—$Cu(1)O_x$ along the c-axis Previous attempts at improving the corrosion resistance of $YBa_2Cu_3O_{7-\delta}$ superconducting materials have involved anion and cationic lattice substitutions or changes to alter intrinsic material corrosion behavior. For example, $YBa_2Cu_3O_{7-\delta}$ material having intermediate oxygen concentration was observed to corrode more slowly than the material with a higher or lower oxygen concentration as described in Zhou et al. in Chem. Mater. 5, 361 (1993) and Solid State Commun. 86, 11 (1993). Cationic substitutions have involved the partial substitution of $Ca^{+2}$ for $Y^{+3}$ and $La^{+3}$ for $Ba^{+2}$ to form compounds such as $Y_{0.6}Ca_{0.4}Ba_{1.6}La_{0.4}CU_3O_7$ ($T_c$ approximately 80K) and have been unsuccessful for some applications which operate at 77K in that the superconducting transition temperature, $T_c$, of the oxide material is adversely affected by the lattice substitution. Although other similar formulations can be prepared having higher transition temperatures by alloying less $Ca^{+2}$ and $La^{+3}$ into the parent lattice, these materials exhibit less corrosion resistance. Therefore, it is desirable to develop alternative procedures for stabilizing the superconductor compounds against environmental degradation. Simply coating the superconductor structures with polymer or metal layers is not adequate for long term storage as the former materials tend to adhere poorly and the latter conductors tend to accelerate corrosion through galvanic processes. Therefore, it is desirable to develop alternative methods for controlling the interfacial properties of high-$T_c$ superconductor compounds.

An object of the present invention is to provide a method of chemically modifying an oxide superconductor surface using adsorbate molecules in a manner to control interfacial surface properties without substantially adversely affecting the superconducting properties, especially the transition temperature, $T_c$, and critical current, $J_c$, of the oxide material.

Another object of the present invention is to provide a method of chemically modifying an oxide superconductor surface using adsorbate molecules in a manner to reduce reactivity of the surface and improve resistance of the surface to chemical degradation, especially environmental degradation, without substantially adversely affecting superconducting properties of the oxide material.

A further object of the present invention is to provide an oxide superconductor surface that is chemically modified in controlled manner by virtue of adsorbate molecules directly bonded thereto to form a surface film or layer without substantially adversely affecting the superconducting properties of the oxide material.

Still another object of the present invention is to provide an oxide superconductor surface having a more chemically resistant surface and improved corrosion resistance by virtue of having adsorbate molecules directly bonded thereto to provide a protective surface film or layer without substantially adversely affecting the superconducting properties of the oxide material.

SUMMARY OF THE INVENTION

The present invention provides a method of chemically modifying a surface of an oxide superconductor by contacting the surface and a molecular reagent including functionalities (functional groups) effective to spontaneously adsorb on the surface to form a molecular monolayer that does not substantially adversely affect the superconducting properties, especially, the $T_c$ temperature, of the oxide material. In practicing the present invention, the molecular reagent can be a liquid or gaseous reagent.

In one embodiment of the present invention, the molecular reagent comprises molecules including ligating functional groups selected from the group consisting essentially of amines, such as alkylamines or arylamines, and thiols, such as alkylthiols, that bind to (ligate) metal ions of the oxide superconductor surface. It should be appreciated that alternative molecular reagents can be used to bind chemically or physically to the surfaces of the high temperature superconductor surface. The invention in one embodiment employs amine and thiol functionalities that form strong coordination bonds to the ionic components of the oxide superconductor lattice. Other modes of binding, such as based on electrostatic or salt formation interactions, are also possible.

A particular embodiment of the present invention provides a method for improving the resistance of a surface of an oxide superconductor to environmental degradation by contacting the oxide surface and a molecular reagent including ligating functionalities that spontaneously bind to metal ions at the surface to form a protective molecular monolayer bonded thereto.

The oxide superconductor surface of the present invention thus is chemically modified by virtue of having adsorbate molecules directly bonded thereto via functional end groups, such as ligating amines and thiols, to form a protective molecular monolayer that does not substantially adversely affect the superconducting properties of the oxide superconductor.

The spontaneous adsorption of molecular layers onto surfaces of high-$T_c$ superconductor surfaces may find utility to produce anti-corrosion layers, adhesion-promoting layers, and layers to faciltiate fabrication of superconductor devices.

The objects and advantages of the present invention will become more readily apparent from the following detailed description taken with the following drawings.

DESCRIPTION OF THE DRAWINGS

FIGS. 3A-1, 3A-2, 3B-1 and 3B-2 comprise atomic force microscope (AFM) images for the thin $YBa_2Cu_3O_{7-\delta}$ film electrode of FIG. 1B before being chemically modified (see FIG. 3A-1 and 3A-2) and after being chemically modified by adsorbate ligand (ferrocenyl) molecules including alkylamine functional end groups (see FIG. 3B 1 and 3B-2).

DETAILED DESCRIPTION OF THE INVENTION

The present invention will be described herebelow for purposes of illustration with respect to the chemical modification of a surface of cuprate superconducting oxides, such as for example the following cuprate superconducting oxide classes: Y—Ba—Cu—O, Bi—Sr—Ca—Cu—O, Tl—Ba—Ca—Cu—O, Hg—Ba—Ca—Cu—O, La—Ba—Cu—O, and other copper-containing superconducting oxide classes, although the invention is not limited to and can be practiced with respect to other non-cuprate oxide superconductor materials. Particular illustrative cuprate oxide superconductor materials to which the invention is applicable include, but are not limited to, $YBa_2Cu_3O_7$, $Tl_2Ba_2Ca_2Cu_3O_{10}$, $Bi_2Sr_2CaCu_2O_8$, and $HgBa_2Ca_2Cu_3O_9$. Since there are now at least 54 unique classes of cuprate superconductor compounds, it is not practical to provide a complete listing here. Rather, the invention provides for the chemical modification of the surface of a wide variety of classes of cuprate and other oxide superconductors via solution or vapor phase assembly.

Although it is unlikely that electrochemical methods will be used to prepare most thin film superconductor devices, electrochemistry does indeed provide effective means for monitoring the assembly of monolayers onto the superconductor surface. In the following paragraphs is information which documents conditions that can be used to form the modified superconductor surfaces of the invention as well electrochemical data that is used to characterize the adsorbate layers. Then, corrosion protection and adhesion applications of the modified superconductor samples is provided.

For purposes of illustration, a plurality of epoxy encapsulated, polycrystalline $YBa_2Cu_3O_{7-\delta}$ bulk ceramic electrodes (where $\delta$ is approximately 0.04) were prepared using the previously reported methods described by McDevitt et al. in technical article J. Electroanal. Chem. 1990, 295, 373–384, the teachings of which are incorporated herein by reference. A plurality of thin film electrodes (1200–1800 Angstroms thick) of $YBa_2Cu_3O_{7-\delta}$ (where $\delta$ is approximately 0.04) were prepared by the laser ablation procedure described by Miyazawa et al. in Advanced Materials, 1993, 5, 179–186, the teachings of which are incorporated herein by reference.

Further, methods for preparing the ceramic and thin film superconductor electrodes are described by McDevitt et al. in Anal. Chem. 1993, 65, 535A–545A, the teachings of which are incorporated herein by reference.

A series of the epoxy encapsulated, polycrystalline $YBa_2Cu_3O_{7-\delta}$ bulk ceramic electrodes having an active electrode area of approximately 1 mm by approximately 3 mm exposed by abrading with sandpaper were treated in dry 1 mM (milliMolar) acetonitrile (ACN) solvent solutions (less than 0.05% water) of the adsorbate ligand (ferrocenyl) molecules (molecular reagent) having different redox-active functional end groups set forth in Table 1. The redox-active functional end groups included alkylamine (#1 in Table 1), arylamine (#2), amide (#3), phosphine (#4), alcohol (#5), and thiol (#6).

TABLE 1

Surface Coverage Values For Redox-active Ligands <u>1</u>–<u>6</u>
* No significant surface coverage measured.

| the "ligands" | | surface coverage (mol/cm$^2$) | |
|---|---|---|---|
| (Fc: ferrocenyl) | | ceramic | thin film |
| FcC(O)NH(CH$_2$)$_2$NH$_2$ | <u>1</u> | 4 × 10$^{-9}$ | 2 × 10$^{-9}$ |
| p-Fe—C$_4$H$_4$—NH$_2$ | <u>2</u> | 1 × 10$^{-9}$ | 5 × 10$^{-11}$ |
| (FcC(O)NHCH$_2$)$_2$ | <u>3</u> | NS* | NS |

TABLE 1-continued

Surface Coverage Values For Redox-active Ligands 1–6
* No significant surface coverage measured.

| the "ligands" | | surface coverage (mol/cm$^2$) | |
|---|---|---|---|
| (Fc: ferrocenyl) | | ceramic | thin film |
| FcO(CH$_2$)$_2$PPh$_2$ | 4 | NS | NS |
| FcCH$_2$OH | 5 | NS | NS |
| FcC(O)(CH$_2$)$_{10}$SH | 6 | 2 × 10$^{-9}$ | 9 × 10$^{-10}$ |

Fresh electrodes (i.e. electrodes which did not have the opportunity to degrade by atmospheric exposure) were immersed (soaked) in the respective solutions of the redox-active functional species for 48 hours. Similar results can be achieved with shorter exposure times in solution as well as with vapor phase treatment of the superconductor surface. After 48 hours of soaking contact with the respective solutions, the electrodes were thoroughly rinsed with ACN and CH$_2$Cl$_2$, which are solvents in which the redox-active functional species are highly soluble.

Cyclic voltammetry was used to assess the degree of chemical surface modification and coverage of the electrode surface. The results of cyclic voltammetry testing indicated that significant coverage of the electrode surface was obtained for the solutions including the redox-active functional end groups or species #1 (alkylamine), #2 (arylamine), and #6 (alkylthiol) as illustrated in Table 1. These functional end groups or moieties #1, #2, an #6 strongly ligate to the metal ions present at the oxide superconductor surface. No significant electrode surface modification or coverage was observed for the solutions including end groups #3 (amide), #4 (phosphine), and #5 (alcohol) as also illustrated in Table 1.

Figure 1A:
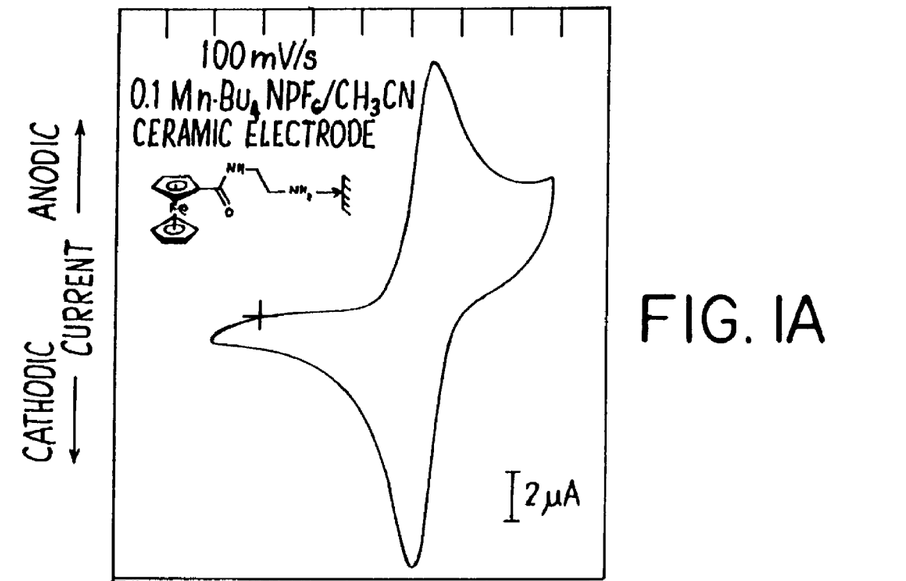
FIG. 1A is a graph of cyclic voltammetry under indicated test conditions of scan rate (mV/s) in the identified solution for a $YBa_2Cu_3O_{-\delta}$ polycrystalline ceramic electrode having a surface chemically modified by adsorbate ligand (ferrocenyl) molecules including alkylamine functional end groups.

The cyclic voltammogram for an epoxy encapsulated, polycrystalline YBa$_2$Cu$_3$O$_{7-\delta}$ electrode having an exposed electrode surface chemically modified by contact with the solution including alkylamine (#1 in Table 1) is shown in FIG. 1A. This cyclic voltammogram was persistent over repeated cycling in the potential window between –0.2 and 1.2 V (volts). The surface coverage for this electrode was determined by integrating the current associated with the ferrocenyl oxidation/reduction to be 4×10$^{-9}$ mole/cm$^3$ and is approximately 10 times greater than that expected for a monolayer of the adsorbate molecule on an ideally flat substrate. The larger values of surface coverages for the bulk ceramic electrodes appear to be consistent with the rough surface morphology and porosity that are characteristic of such bulk ceramic electrodes. The cyclic voltammogram of FIG. 1A is indicative of strong adsorption of the ligand molecules via bonding the ligating alkylamine functionality. These results demonstrate that the self-assembly method of the invention can be used for the complete coverage of even highly roughened superconductor surface structures as described hereabove, which exhibited a less desirable surface morphology than would usually be encountered.

The cyclic voltammograms for epoxy encapsulated, polycrystalline YBa$_2$Cu$_3$O$_{7-\delta}$ bulk ceramic electrodes having an exposed electrode surface chemically modified by contact with the solutions including arylamine (#2 in Table 1) and alkylthiol (#6 in Table 1) were similar in shape to that shown in FIG. 1A, but exhibited significantly less electrode surface coverage.

After 30 cycles at 200 mV/second in cyclic voltammetry testing, there was no detectable loss in electroactivity for the bulk electrodes soaked in the solutions including functional moieties #1 and #2. In contrast, monolayer films formed on the exposed bulk ceramic electrode surface by soaking in the solution including functional moiety #6 exhibited a slow, steady loss in electroactivity as a result of repeated cycling in this manner. These results demonstrate that the alkylamine functionality is particularly suited to bind strongly to the surface of the superconductor. The other functionalities are less effective in this regard.

The thin film electrodes (1200–1800 Angstroms thick) of YBa$_2$Cu$_3$O$_{7-\delta}$ described hereabove were immersed (soaked) for 48 hours in the respective solutions of the redox-active functional species #1 (alkylamine), #2 (arylamine), and #6 (alkylthiol) that were effective to form adsorbed monolayers on the ceramic bulk electrodes. After 48 hours of soaking contact with the respective solutions, the thin film electrodes were thoroughly rinsed with ACN and CH$_2$Cl$_2$ as described hereabove.

Figure 1B:
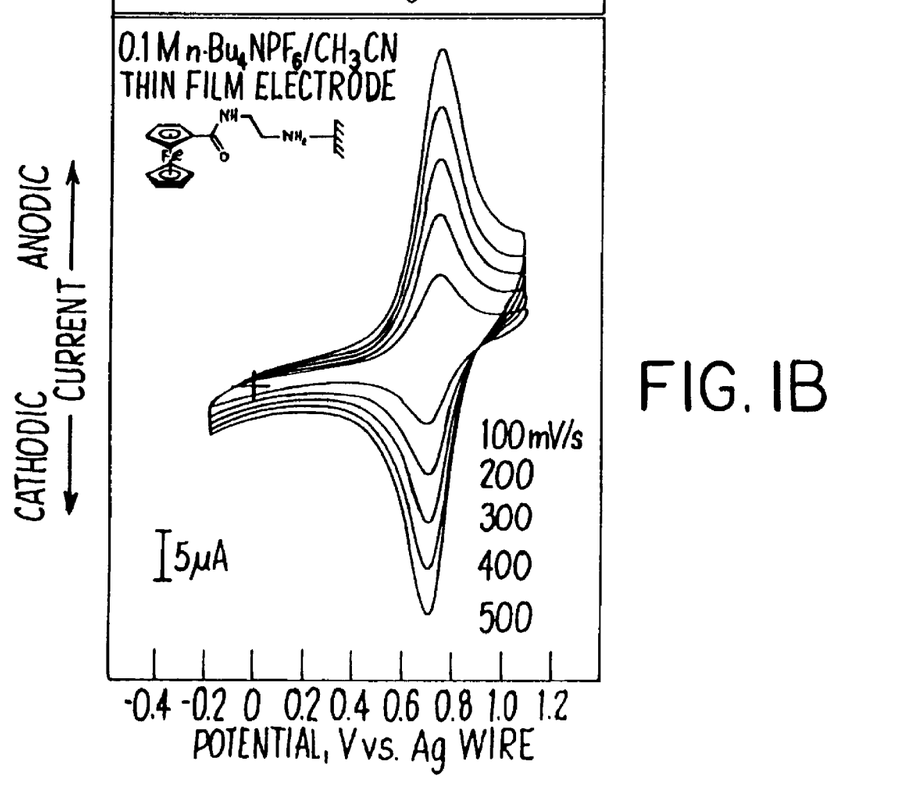
FIG. 1B is a graph of sweep rate dependent cyclic voltammetry under indicated test conditions for a c-axis oriented, thin $YBa_2Cu_3O_{7-\delta}$ film (1500 Angstroms thick) on a (100) MgO single crystal substrate wherein the thin film surface is chemically modified by adsorbate ligand (ferrocenyl) molecules including alkylamine functional end groups.
Figure 2:
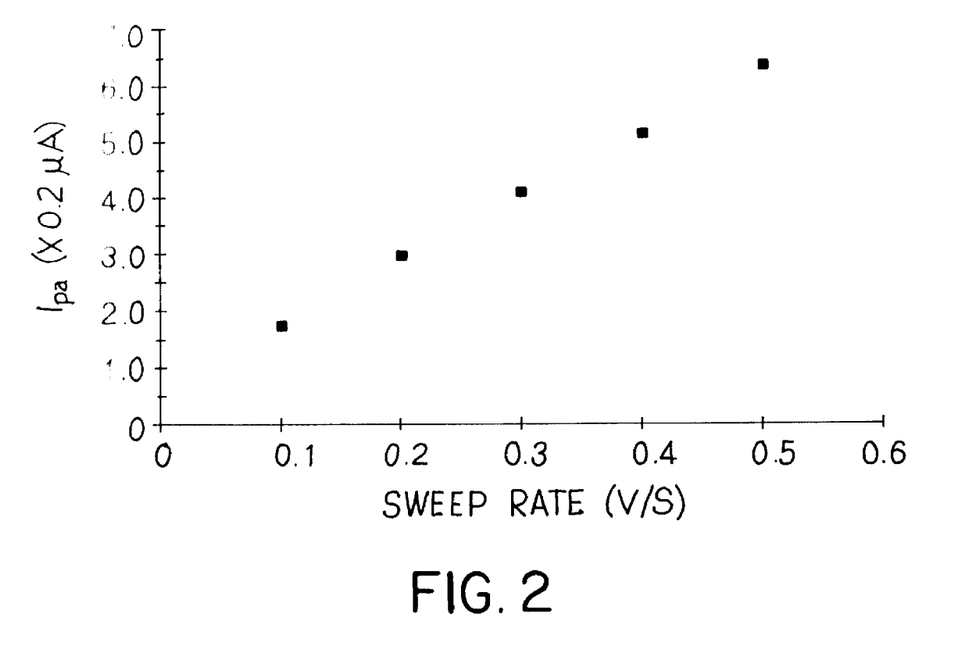
FIG. 2 is a graph of the variation of anodic peak current versus sweep rate for an electrode modified with a layer of alkylamine (#1 in Table 1). The linear response is indicative of a surface-confined redox group.
Figure 3A:
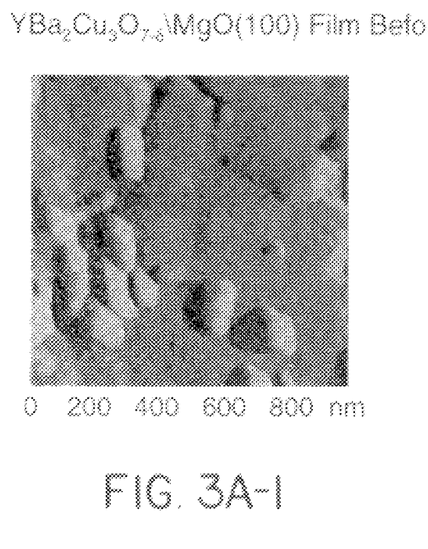
Figure 3A:
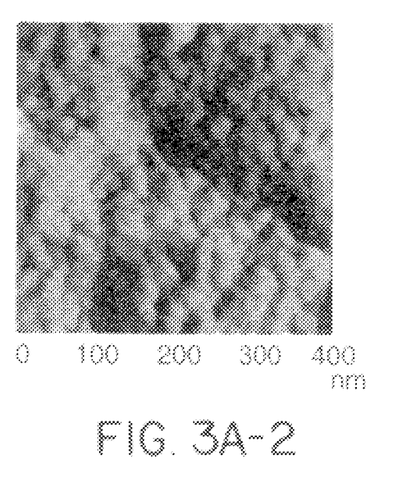
Figure 3B:
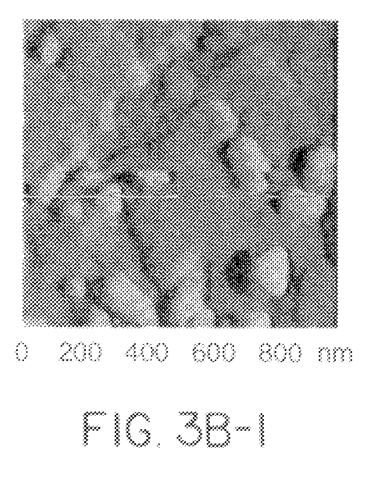
Figure 3B:
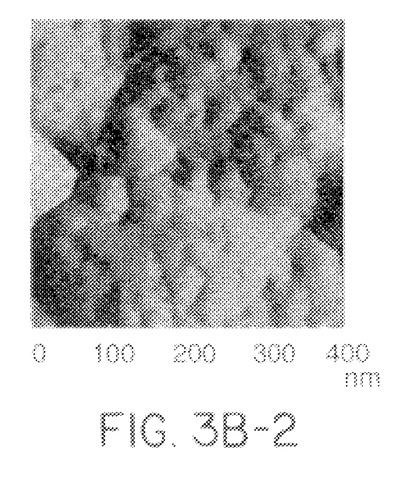

The cyclic voltammogram for the thin film YBa$_2$Cu$_3$O$_{7-\delta}$ electrode having an electrode surface chemically modified by contact with the solution including alkylamine (#1 in Table 1) is shown in FIG. 1B and indicates spontaneous adsorption of the ligand molecules on the fresh laser-ablated, c-axis electrode thin film surface as a redox-active monolayer. This cyclic voltammogram exhibits a surface-confined wave associated with ferrocenyl oxidation at 0.73 V versus Ag wire (delta E$_p$ approaching 0 at low scan rates and i$_p$, proportional to scan rate, FIG. 2) as shown in FIG. 1B. Collectively, these results demonstrate that approximately one monolayer adsorbs spontaneously onto the surface of the superconductor under the described conditions. Moreover, chemical damage of the superconductor is avoided during the adsorption process as indicated by the reversible nature of the voltammetric wave. The lack of an insulating barrier formed during the assembly process is expected from such results.

The surface coverage for this chemically modified thin film electrode is closer to ideality than that measured for the ceramic bulk electrode of FIG. 1A and yet is still larger than that expected for a perfectly flat surface, apparently as a result of film surface roughness. Indeed, atomic force microscopy (AFM) images of the thin film electrodes described hereabove indicated that they were substantially rough on a nanometer (nm) scale, FIG. 3. These experiments demonstrate the utility of the self-assembly method of the invention for the modification of the interfacial properties of the high-T$_c$ thin film structures.

Figure 1C:
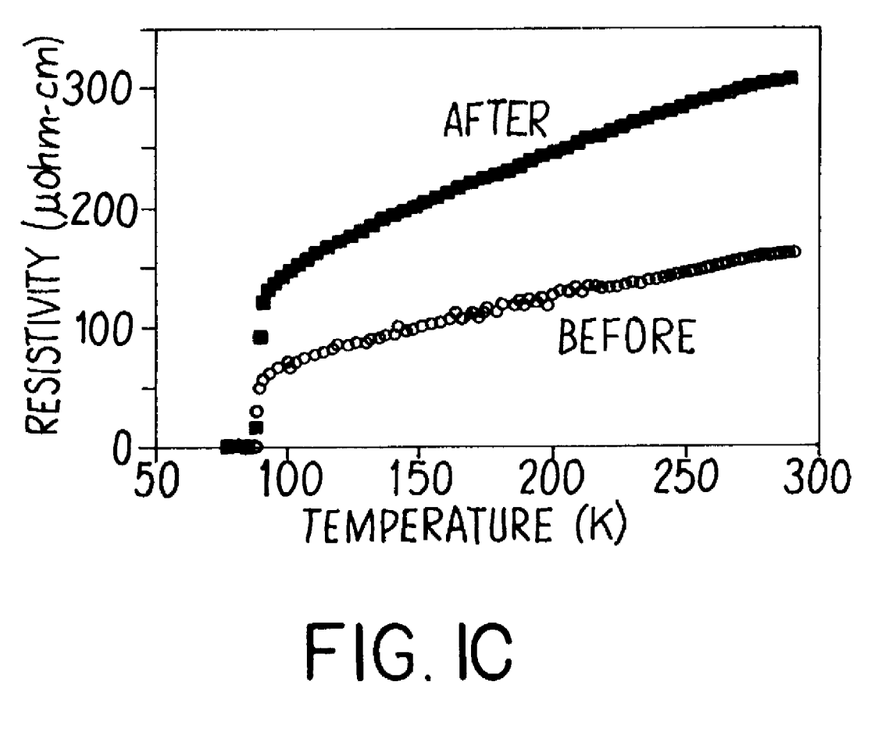
FIG. 1C is a graph of resistivity versus temperature for the thin $YBa_2Cu_3O_{7-\delta}$ film of FIG. 1B before being chemically modified (represented by open circle data points) and after being chemically modified by adsorbate ligand (ferrocenyl) molecules including alkylamine functional end groups (represented by solid square data points).

Significantly, the superconducting properties of the thin film YBa$_2$Cu$_3$O$_{7-\delta}$ electrodes remained substantially intact after chemical modification pursuant to the invention. For example, referring to FIG. 1C, a temperature versus resistvity graph for a representative thin film of YBa$_2$Cu$_3$O$_7$ before and after chemical modification by soaking in the ACN solution of the functional end group (#1) alkylamine is shown. There is little, if any, decrease in the transition temperature, T$_c$, for the oxide superconductor after the surface modification treatment where the electrode is soaked for short periods of time (e.g. approximately 3 hours soak in the solution). After the longer soaking times (48 hours) used to prepare most electrodes, there was a small decrease (approximately 2K) in the T$_c$ temperature. Moreover, the small decrease in T$_c$ can be reduced by shortening the time of the electrode soaking treatment in the solution, by using dry (i.e. water free) solvents, or by using vapor phase (solvent free) adsorption methods.

Figure 4A:
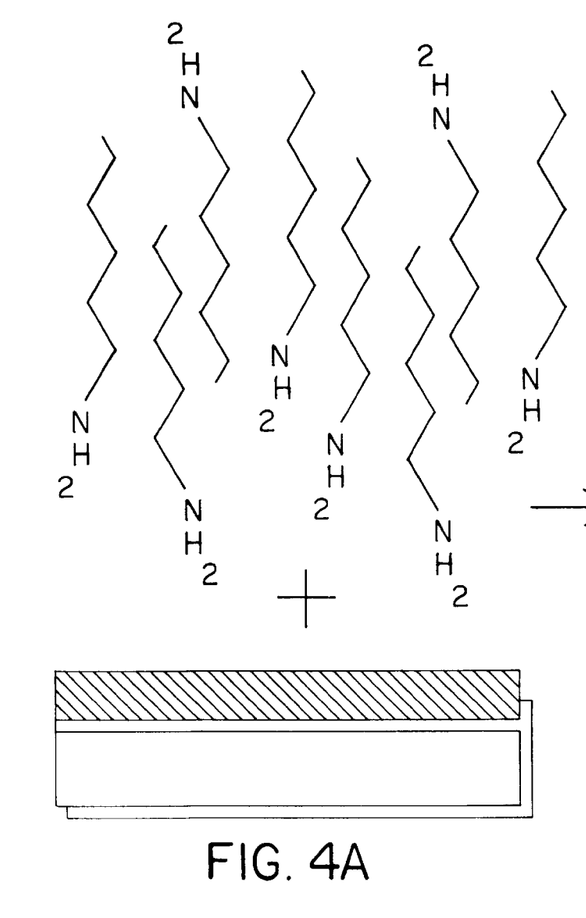
FIG. 4A and 4B are schematic representations illustrating spontaneous adsorption of a molecular monolayer onto oxide (cuprate) superconductor surfaces via ligating hexylamine functional end groups.
Figure 4B:
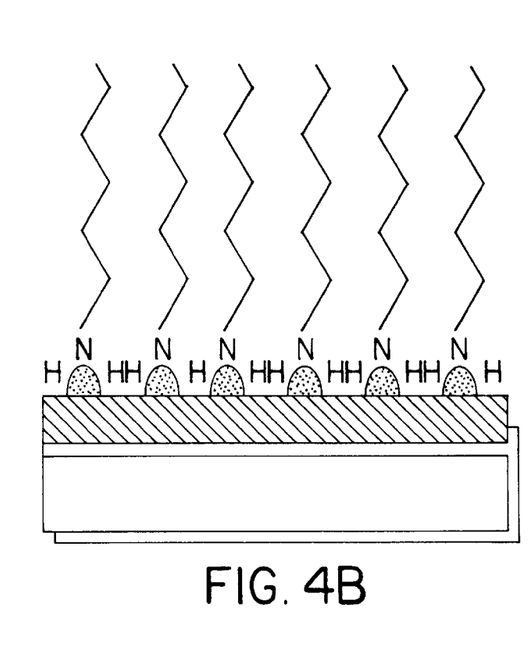

Other non-redox active molecules can be adsorbed as monolayer films pursuant to the invention on the oxide superconductor surface via ligating end functionalities. For example, alkylamine molecules of different lengths (e.g. $CH_3(CH_2)_5NH_2$, $CH_3(CH_2)_{11}NH_2$, and $CH_3(CH_2)_{17}NH_2$) were adsorbed on the aforementioned bulk and thin film $YBa_2Cu_3O_{7-\delta}$ surface structures by soaking in the respective 1.0 mM ACN solutions of the particular adsorbate molecule for 24–48 hours. FIG. 4A shows in schematic fashion how superconductor surface structures can be modified with the alkylamine molecules. Here, the superconductor element is exposed to a solution or vapor phase environment containing the adsorbate molecule. The amine functionality has a high affinity for the copper ions which make up the superconductor lattice. Therefore, an adsorption process occurs leading to the spontaneous collection of a compact monolayer onto the superconductor surface. Upon removal of the excess adsorbate molecules, a derivatized superconductor surface is created as illustrated in FIG. 4B.

Fluorocarbon molecules (e.g. $CF_3(CF_2)_7(CH_2)_2NH_2$) having a ligating amine functional end group also were adsorbed on the aforementioned bulk and thin film samples of $YBa_2Cu_3O_{7-\delta}$ by soaking in a 1.0 mM ACN solution of the adsorbate molecules for 24 hours. In addition, each of fullerene-terminated, pyrrole-terminated, and thiophene-terminated alkane amines were adsorbed pursuant to the invention onto the surfaces of bulk ceramic and thin film superconductor substrates of $YBa_2Cu_3O_{7-\delta}$. Also, photosensitive azide-terminated alkanethiols and photosensitive azide-terminated alkaneamines were adsorbed onto the surfaces of the bulk ceramic and thin film substrates of $YBa_2Cu_3O_{7-\delta}$ pursuant to the invention; these monolayers can be used as molecular resists for photolithographic patterning.

The invention is not limited to the particular adsorbate molecules described hereabove which are offered only for purposes of illustrating rather than limiting the invention.

Moreover, although the invention has been described hereabove with respect to contacting the bulk or thin film oxide superconductor surface with a liquid reagent to chemically modify it pursuant to the invention, the invention is not so limited and can be practiced using other procedures for contacting the oxide superconductor surface and the molecular reagent. For example, alternately, volatile molecular reagents can be contacted with the oxide superconductor surface to provide vapor-phase chemical modification of the surface. An illustrative gaseous molecular reagent to this end includes, but is not limited to, the above alkylamine and fluoroamine reagents, which can be contacted at a temperature of 50–200 degrees C. and pressure of $10^{-4}$ to 10 torr via CVD (chemical vapor deposition) with the oxide superconductor surface to form the adsorbed monolayer thereon. The liquid and gaseous molecular reagents are compatible with existing commercial processing methods used to prepare cuprate superconductor systems. The use of a gaseous molecular reagent is particularly suited to electronic manufacturing applications.

The environmental stability of the chemically modified oxide superconductor surfaces of the present invention were significantly improved as compared to that of untreated material. For example, the aforementioned bulk and thin film samples of $YBa_2Cu_3O_{7-\delta}$ chemically modified by contact with the solutions including ligating functional groups alkylamine (#1), arylamine (#2), and alkylthiol (#6) were prepared under ambient air, humidity, and temperature conditions on a workbench with no substantial adverse effect on superconducting properties. Moreover, the aforementioned bulk or thin film samples of $YBa_2Cu_3O_{7-\delta}$ chemically modified by contact with the solution including ligating functional groups alkylamine (#1) were soaked in neat ACN for three days with no noticeable loss of electroactivity associated with the ligand (ferrocenyl) monolayer. When similar unmodified (uncoated) electrodes were soaked in ACN for three days under comparable conditions, the electrodes degraded as evidenced by the formation of a passivating corrosion layer and the loss of electroactivity.

A further demonstration of the utility of the self-assembly method of the invention for chemical modification of the cuprate superconductor surfaces can be found from evaluations of the surface reactivity properties of the modified surface structures versus unmodified surface structures.

Figure 5A:
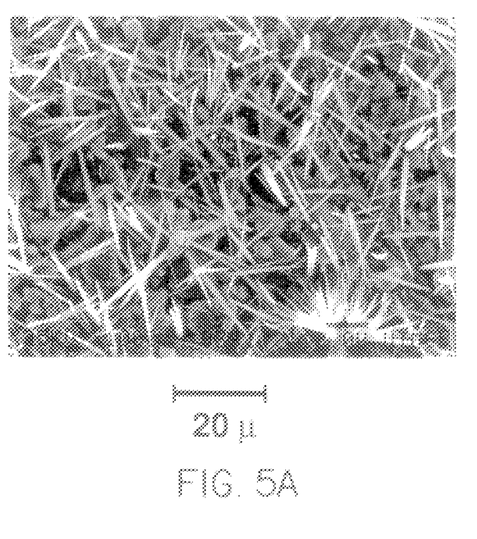
FIG. 5A is a scanning electron micrograph of an uncoated $YBa_2Cu_3O_7$ ceramic pellet after one day's exposure to aerated water held at room temperature.
Figure 5B:
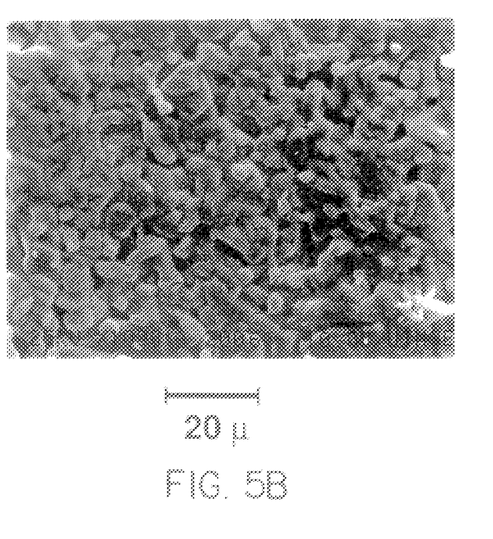
FIG. 5B is a scanning electron micrograph of a $YBa_2Cu_3O_7$ ceramic pellet treated with a solution of hexylamine after similar exposure to aerated water solution

Referring to FIG. 5A, there is shown a scanning electron micrograph of an uncoated $YBa_2Cu_3O_7$ ceramic pellet after one day's exposure to aerated water solution. In contrast, FIG. 5B is a scanning electron micrograph of a similar $YBa_2Cu_3O_7$ ceramic pellet chemically modified (by soaking in a 1.0 mM ACN solution of hexylamine for 24 hours) after similar to exposure to water. The uncoated $YBa_2Cu_3O_7$ pellet of FIG. 5A degraded rapidly over a period of one day upon exposure to water (deionized) at ambient temperature as evidenced by the formation of $BaCO_3$ on the superconductor surface. This impurity phase (corrosion product) collected on the oxide superconductor surface as a result of corrosion, and can be observed readily by scanning electron microscopy. In contrast, the chemically modified $YBa_2Cu_3O_7$ pellet having the densely packed, protective hexylamine adsorbed monolayer pursuant to the invention showed little signs of corrosion under the same conditions. The substantially improved resistance to corrosion of the chemically modified $YBa_2Cu_3O_7$ pellet in this test demonstrates the benefits obtainable by practice of the present invention. In addition to pellets, bulk ceramic includes tape, wire, and other bulk forms of oxide superconductors.

Thus, the adsorbed, densely packed monolayers of the invention described hereabove can constitute anti-corrosion layers to overcome the problems associated heretofore with reactive cuprate superconductor surfaces in service as well as during manufacturing of superconductor devices. The spontaneous adsorption of selected monolayer films pursuant to the invention on the superconductor surface can be used to provide enviromentally protective layers that can facilitate manufacture of superconductor devices or structures and extend the service lifetime especially of thin film superconductors without substantially adversely affecting superconducting properties such as $T_c$ and $J_c$.

For many high-$T_c$ thin film superconductor devices, it will be necessary to package the superconductor structure in an attempt to reduce the aforementioned corrosion problem. The packaging of the superconductor is necessary for the protection of the fragile circuit elements from mechanical abrasion. In any case, metal, metal oxide or polymer layers will be exploited for this purpose. Because of the differences in the properties of the superconductor/substrate with those of the protection barrier layer, poor adhesion between the materials may result. Atomic level control of the surface chemistry of the superconductor pursuant to the invention may assist in overcoming this problem as well. For example, self-assembled monolayers (SAM) deposited on high-$T_c$ superconductors may be used as resists in e-beam lithographic methods. The molecular thickness (10–30 Angstroms) of the SAM will lead to greater resolution in the lithographic process. The amine-tagged fuorocarbon molecule referred to hereabove (i.e. $CF_3(CF_2)_7(CH_2)_2NH_2$) adsorbed on a $YBa_2Cu_3O_7$ thin film produced an improvement in the adhesion of an approximately 1 micron thick film of Teflon thereon. Thus, improved packaging of both bulk and thin film configurations of cuprate superconductors may be provided by practice of the present invention to chemically modify the superconductor surface properties.

Further, as a result of the short coherence length exhibited by the high-$T_c$ superconductor and the problems experienced heretofore with interfacial reactivity of oxide superconductor surfaces, the preparation of high-$T_c$ junctions has been problematic. Molecular control of the superconductor surface properties through chemical modification pursuant to the invention may afford a more direct method to overcome this problem and provide chemically tailored molecule/superconductor devices using self-assembly of adsorbed monolayers.

Although the invention has been described with respect to certain specific embodiments thereof, those skilled in the art will recognize that these embodiments were offered for purposes of illustration rather than limitation and that the invention is not limited thereto but rather only as set forth in the appended claims.

We claim:

1. A method of chemically modifying a surface of an oxide superconductor, comprising contacting said surface with a molecular reagent including ligating functional groups which spontaneously adsorb on said surface to form a molecular layer bonded to said surface.

2. The method of claim 1 wherein said molecular reagent is deposited onto said surface from a liquid phase or a vapor phase.

3. The method of claim 1 wherein said functionalities are ligating functionalities selected from the group consisting of amines and thiols.

4. The method claim 3 wherein said amines comprise alkylamines or arylamines.

5. The method of claim 3 wherein said thiols comprise alkylthiols.

6. The method of claim 1 wherein said oxide superconductor is in the form of a bulk ceramic or a thin film.

7. The method of claim 6 wherein said bulk ceramic is in the form of a pellet, wire, or tape.

8. The method of improving the resistance of a surface of an oxide superconductor to chemical degradation, comprising contacting said surface with a molecular reagent including ligating functional groups selected from the group consisting of amines and thiols which spontaneously adsorb on said surface to form a protective molecular bonded to said surface.

9. A method of claim 8 wherein said molecular reagent is deposited onto said surface from a liquid phase or a vapor phase.

10. The method of claim 8 wherein said amines comprise alkylamines or arylamines.

11. The method of claim 8 wherein said thiols comprise alkylthiols.

12. An oxide superconductor surface chemically modified by having adsorbate molecules directly attached thereto via ligating functional groups which form in-situ a molecular monolayer at said surface.

13. An oxide superconductor surface having improved resistance to chemical degradation by having adsorbate molecules with ligating functional groups selected from the group consisting of amines and thiols adsorbed directly on said surface to form a protective molecular monolayer at said surface.

14. The surface of claim 13 wherein said amines comprise alkylamines or arylamines.

15. The surface of claim 13 wherein said thiols comprise alkylthiols.

16. A cuprate superconductor surface having improved resistance to chemical degradation by having adsorbate molecules with ligating functional groups comprising amines adsorbed directly on said surface to form a protective molecular monolayer at said surface.

17. The surface of claim 16 wherein said functional groups comprise alkylamines.

18. An oxide superconductor surface chemically modified by having adsorbate molecules directly attached thereto via functional groups selected from the group consisting of amines and thiols to form a molecular monolayer at the surface.

19. The surface of claim 18 wherein said amines comprise alkylamines or arylamines.

20. The surface of claim 18 wherein said thiols comprise alkylthiols.

* * * * *

UNITED STATES PATENT AND TRADEMARK OFFICE
CERTIFICATE OF CORRECTION

PATENT NO. : 5,846,909
DATED : December 8, 1998
INVENTOR(S) : John T. McDEVITT, et al It is certified that error appears in the above-identified patent and that said Letters Patent is hereby corrected as shown below:

Col. 10, line 3, after "molecular" insert ---monolayer---.

Signed and Sealed this

Twenty-eighth Day of December, 1999

Attest:

Q. TODD DICKINSON

*Attesting Officer*   *Acting Commissioner of Patents and Trademarks*